US012666908B2

(12) United States Patent
de Ridder et al.

(10) Patent No.: US 12,666,908 B2
(45) Date of Patent: Jun. 23, 2026

(54) PURGE NOZZLE ASSEMBLY AND SEMICONDUCTOR PROCESSING ASSEMBLY INCLUDING THE PURGE NOZZLE ASSEMBLY

(71) Applicant: ASM IP Holding B.V., Almere (NL)

(72) Inventors: Christianus G.M. de Ridder, Hoogland (NL); Klaas P. Boonstra, Hilversum (NL)

(73) Assignee: ASM IP Holding B.V., Almere (NL)

( * ) Notice: Subject to any disclaimer, the term of this patent is extended or adjusted under 35 U.S.C. 154(b) by 831 days.

(21) Appl. No.: 17/326,706

(22) Filed: May 21, 2021

(65) Prior Publication Data

US 2021/0375644 A1 Dec. 2, 2021

Related U.S. Application Data

(60) Provisional application No. 63/029,947, filed on May 26, 2020.

(51) Int. Cl.
H10P 72/10 (2026.01)
H10P 72/30 (2026.01)
H10P 72/50 (2026.01)

(52) U.S. Cl.
CPC ......... H10P 72/1926 (2026.01); H10P 72/10 (2026.01); H10P 72/1912 (2026.01); H10P 72/1916 (2026.01); H10P 72/1918 (2026.01); H10P 72/3218 (2026.01);
(Continued)

(58) Field of Classification Search
CPC ..... H01L 21/6735–67396; H10P 72/10; H10P 72/1912; H10P 72/1914; H10P 72/1916; H10P 72/1918; H10P 72/1924; H10P 72/1926; H10P 72/3218; H10P 72/3408; H10P 72/50

See application file for complete search history.

(56) References Cited

U.S. PATENT DOCUMENTS

| | | | |
|---|---|---|---|
| 5,841,095 A * | 11/1998 | Lu | H05H 1/38 |
| | | | 219/121.48 |
| 7,086,245 B2 * | 8/2006 | Yee | F16K 31/0651 |
| | | | 251/129.21 |
| 8,596,312 B2 | 12/2013 | Natsume et al. | |

(Continued)

FOREIGN PATENT DOCUMENTS

| | | |
|---|---|---|
| CN | 109449115 A | 3/2019 |
| JP | 2014036185 A | 2/2014 |

(Continued)

*Primary Examiner* — Kurt Sweely
(74) *Attorney, Agent, or Firm* — Snell & Wilmer L.L.P.

(57) ABSTRACT

A purge nozzle assembly comprising a purge nozzle body including an inlet opening and an outlet opening. The outlet opening opens into a purge nozzle contact surface. Additionally, the purge nozzle assembly includes a mounting body for connecting the purge nozzle assembly to an external frame member. A mechanical coupling mechanism moveably couples the purge nozzle body with the mounting body and is configured to allow tilting of the purge nozzle body relative to the mounting body as well as to allow a substantial lateral movement of the purge nozzle body relative to the mounting body, wherein the lateral movement has a movement component which is substantially parallel to the purge nozzle contact surface.

24 Claims, 9 Drawing Sheets

(52) U.S. Cl.
CPC ...... H10P 72/3408 (2026.01); *H10P 72/1924*
(2026.01); *H10P 72/50* (2026.01)

(56)     References Cited

U.S. PATENT DOCUMENTS

| | | | |
|---|---|---|---|
| 9,174,253 B2 | 11/2015 | Natsume et al. | |
| 9,786,531 B2 | 10/2017 | Sasaki et al. | |
| 9,824,907 B2 * | 11/2017 | Igarashi | H01L 21/67775 |
| 9,833,817 B2 | 12/2017 | Sasaki | |
| 10,217,656 B2 | 2/2019 | Murata et al. | |
| 11,201,072 B2 | 12/2021 | Oh et al. | |
| 11,380,567 B2 | 7/2022 | Yoon et al. | |
| 2016/0365266 A1 * | 12/2016 | Murata | H01L 21/67775 |

FOREIGN PATENT DOCUMENTS

| | | | |
|---|---|---|---|
| JP | 2018129530 A | 8/2018 | |
| TW | M550182 U | 10/2017 | |
| WO | 2012108418 A1 | 8/2012 | |

* cited by examiner

PURGE NOZZLE ASSEMBLY AND SEMICONDUCTOR PROCESSING ASSEMBLY INCLUDING THE PURGE NOZZLE ASSEMBLY

CROSS-REFERENCE TO RELATED APPLICATIONS

This application claims priority to U.S. Provisional Patent Application Ser. No. 63/029,947 filed May 26, 2020 titled "PURGE NOZZLE ASSEMBLY AND SEMICONDUC-TOR PROCESSING ASSEMBLY INCLUDING THE PURGE NOZZLE ASSEMBLY," the disclosure of which is hereby incorporated by reference in its entirety.

FIELD

The present disclosure generally relates to a purge nozzle assembly and semiconductor processing assembly including the purge nozzle assembly

BACKGROUND

For certain applications in the semiconductor industry a system of purging wafer cassettes is developed that uses wafer cassettes with purge ports at the bottom. The system requires purge nozzles at certain locations where the wafer cassette is placed. The interface where the wafer cassette is placed on, can be a kinematic coupling interface that allows a certain side wards movement of the wafer cassette during placement on these couplings and or placement wafer cas-sette at an angle. The purge nozzle may be used to insert a particle free gas into the wafer cassette through the port of the wafer cassette. JP6519897B2 discloses a purge nozzle assembly.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It is realized that the placement of the purge nozzle against a wafer cassette surface surrounding the purge port should be done in such a way that particle generation may be minimized. In general, a grommet may be mounted on around the purge port on the wafer cassette and/or on the purge nozzle assembly and in that case may provide a purge nozzle contact surface. Additionally, the engagement between the purge nozzle and the purge port should be such that any leakage may be minimized.

To that end, there may be provided a purge nozzle assembly according to claim 1. More particularly, there may be provided a purge nozzle assembly which may comprise:

a purge nozzle body that may include an inlet opening and an outlet opening wherein the outlet opening may open into a purge nozzle contact surface;

a mounting body for connecting the purge nozzle assem-bly to an external frame member;

a mechanical coupling mechanism that may moveably couple the purge nozzle body with the mounting body and that may be configured to:

allow tilting of the purge nozzle body relative to the mounting body; and to allow a substantial lateral movement of the purge nozzle body relative to the mounting body, wherein the lateral movement may have a movement component which may be substantially parallel to the purge nozzle contact surface.

The disclosure may also provide a semiconductor pro-cessing assembly according to claim 20. More particularly, there may be provided a semiconductor processing assembly that may comprise at least one wafer cassette supporting position and at least one wafer cassette. The wafer cassette may comprise a purge port for supplying purge gas into an interior of the wafer cassette. The semiconductor processing assembly may comprise a purge nozzle assembly according to present disclosure which may be positioned relative to the wafer cassette supporting position such that, when a wafer cassette is placed on the wafer cassette supporting position, the purge nozzle contact surface may engage the wafer cassette around the purge port during placement of the wafer cassette substantially without a rubbing or sliding movement between the purge nozzle contact surface and the wafer cassette.

Due to the fact that the mechanical coupling mechanism of the purge nozzle may allow tilting of the purge nozzle body relative to the mounting body and a substantial lateral movement of the purge nozzle body relative to the mounting body, rubbing or sliding movement between the purge nozzle contact surface and the wafer cassette may be mini-mized. The purge nozzle unit of JP6519897132 also includes a purge nozzle body and a mounting body and a mechanical coupling mechanism to moveably couple the purge nozzle body with the mounting body and that may be configured to allow tilting of the purge nozzle body relative to the mount-ing body. However, the mechanical coupling mechanism of JP'897 does not allow a substantial lateral movement of the purge nozzle body relative to the mounting body, wherein the lateral movement may have a movement component which may be substantially perpendicular to the central axis.

With the purge nozzle assembly according to the present disclosure, as soon as the purge nozzle touches the wafer cassette around the purge port during placement of the wafer cassette on the cassette supporting position, the friction forces between the purge nozzle contact surface and wafer cassette may be larger than the forces which are needed to move the purge nozzle body relative to the mounting body. Between the purge nozzle contact surface and the wafer cassette a grommet may be positioned. The grommet may be mounted on the wafer cassette around the purge port. Alternatively, the grommet may be mounted on the purge nozzle contact surface. Due to the fact that the mechanical coupling mechanism is configured to allow a substantial lateral movement of the purge nozzle body relative to the mounting body, any lateral movement of the wafer cassette may be accommodated by the purge nozzle body substan-tially without any sliding or rubbing between the purge nozzle contact surface and the wafer cassette. Thus, any possible release of particles due to such sliding and rubbing may be prevented. As the mechanical coupling mechanism allows tilting, the purge nozzle contact surface may always engage wafer cassette around the purge port in a sealing manner even the wafer cassette is not completely horizon-tally level. So, even in case of such a non-horizontal wafer cassette or of a non-horizontal grommet positioned between the purge nozzle contact surface and the wafer cassette surface surrounding the purge port, leakage may be pre-vented.

For purposes of summarizing the invention and the advan-tages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

Various embodiments are claimed in the dependent claims, which will be further elucidated with reference to an example shown in the figures. The embodiments may be combined or may be applied separate from each other.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF THE FIGURES

Figure 1:
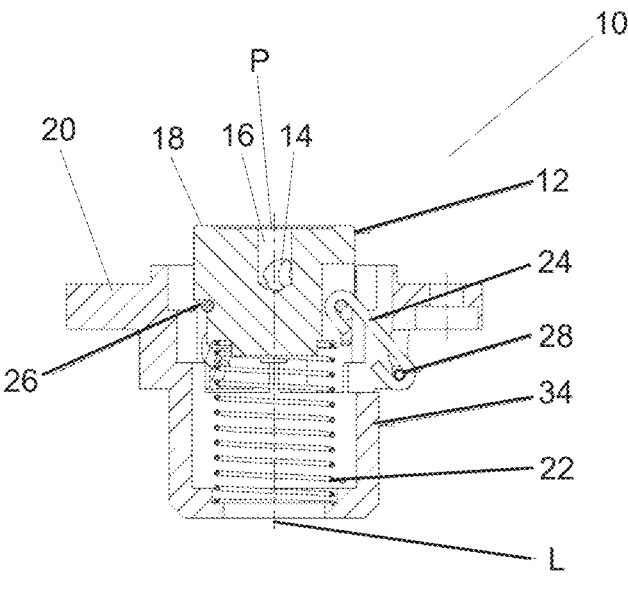
FIG. 1 shows a cross-sectional view of a first example of a purge nozzle.

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "wafer" may refer to any underlying material or materials that may be used, or upon which, a device, a circuit, or a film may be formed.

In the most general terms, the present disclosure may provide a purge nozzle assembly 10 comprising a purge nozzle body 12 which may include an inlet opening 14 and an outlet opening 16 wherein the outlet opening 16 may open into a purge nozzle contact surface 18. The purge nozzle contact surface may be substantially perpendicular to a central axis L of the purge nozzle body 12. The purge nozzle assembly may additionally include a mounting body 20 for connecting the purge nozzle assembly 10 to an external frame member. A mechanical coupling mechanism may moveably couple the purge nozzle body 12 with the mounting body 20. Examples of purge nozzles of the present disclosure are shown in FIGS. 1 to 7. The mechanical coupling mechanism may be configured to allow tilting of the purge nozzle body 12 relative to the mounting body 20 and to allow a substantial lateral movement of the purge nozzle body 12 relative to the mounting body 20. The lateral movement may be substantially parallel to the purge nozzle contact surface and/or defined perpendicular to the central axis L.

Advantages of the purge nozzle assembly according of the present disclosure have been described in the summary section and are incorporated here by reference.

In an embodiment of the purge nozzle assembly 10, of which examples are shown in FIGS. 1-7, the mechanical coupling mechanism may comprise at least one spring 22 which may be connected to the purge nozzle body 12 and the mounting body 20. The at least one spring 22 may be configured to bias the purge nozzle body 12 relative to the mounting body 20 in a direction along the central axis L and directed away from the purge nozzle contact surface 18. In this embodiment, a number of pull elements 24 may be connected with the purge nozzle body 12 and the mounting body 20. The pull elements 24 may be pulled taut by the at least one spring 22 to provide a defined initial position of the purge nozzle body 12 relative to the mounting body 20. The at least one spring 22 may be pretensioned in the defined initial position. This pretension may result in a large enough force between the purge nozzle body 12 and the wafer cassette 104 or a grommet 108 for obtaining a proper sealing between the purge nozzle body 12 and wafer cassette 104 or the grommet 108.

Figure 12:
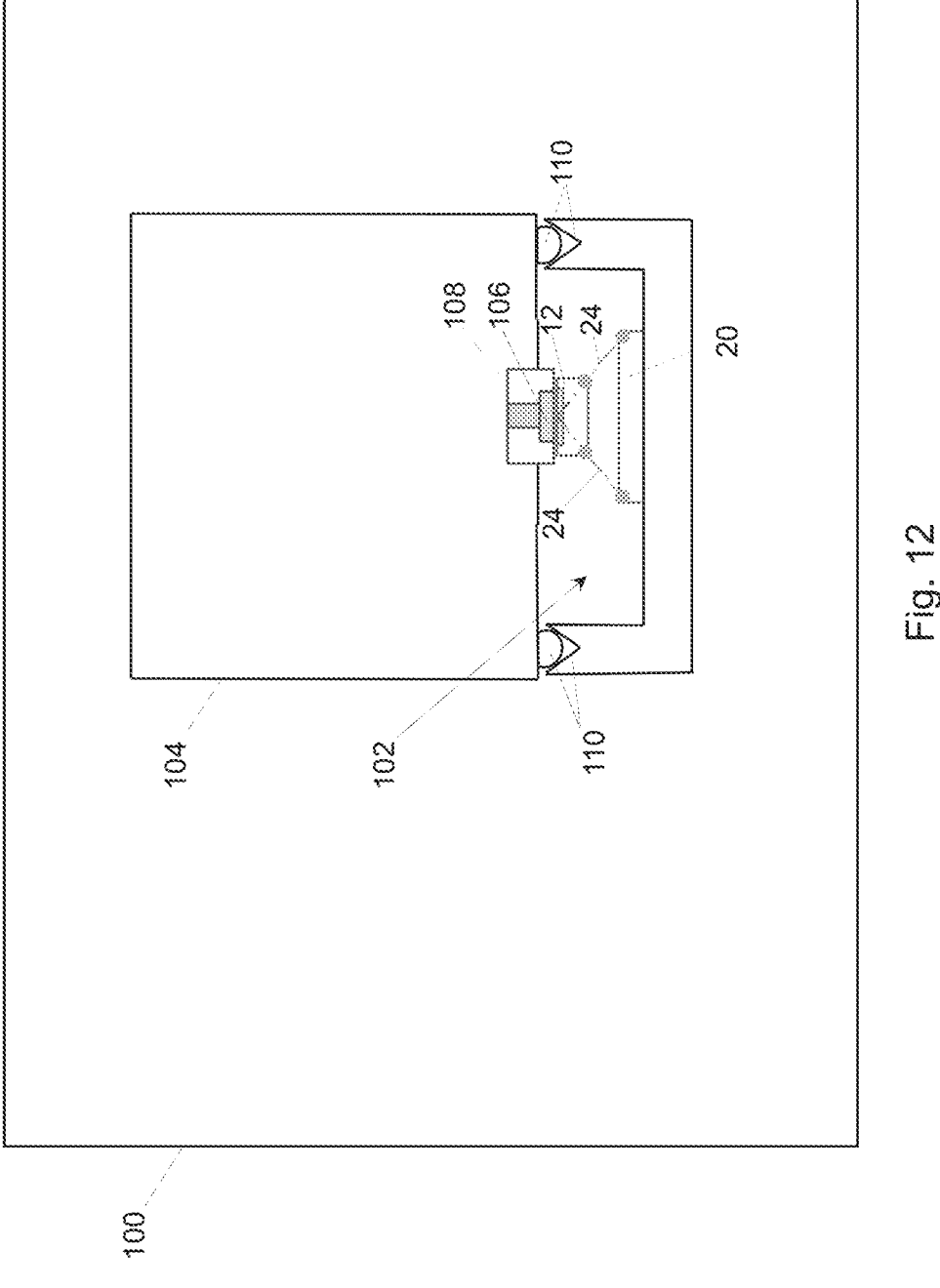
FIG. 12 shows a schematic cross-sectional view of a semiconductor processing assembly.

By means of the pull elements 24, a substantial lateral movement M3 of the purge nozzle body 12 relative to the mounting body 20 may be allowed. The lateral movement has a movement component which may be substantially perpendicular to the central axis (L) as is clearly indicated by arrows M3 in FIG. 9A, 9B and FIG. 11. Especially when the wafer cassette 104 is placed on a kinematic coupling 110 of which an example is schematically shown in FIG. 12, this lateral movement may occur during placement of the wafer cassette 104 on the kinematic coupling 110. By virtue of the pull elements 24 this combined lateral and downward movement of the wafer cassette 104 may be followed by the purge nozzle body 12 without any substantial rubbing or sliding movement between the contact surface 18 of the purge nozzle body 12 and the wafer cassette 104 or the grommet 108 which may be mounted on the wafer cassette 104. Thus, the release of particles during placement of the wafer cassette 104 may be minimized.

In an embodiment, the length of the pull elements 24 may be preferably such that if the pull element 24 is still pulled taut and thus acting as a linkage, then the circular movement that the purge nozzle body 12 is able to make may have a radius that is large enough so that the lateral movement that the purge nozzle body 12 is able to make may be equal or larger than the limits which are defined in the SEMI for the allowed lateral movement of wafer cassettes 102 being placed on a kinematic coupling 110. Thus, the purge nozzle body 12 may follow any lateral movement within the limits for lateral movement of wafer cassettes as defined in the SEMI. Typically, a length of each pull element may be at least 10 mm and an angle of the pull element 24 relative to the horizontal plane may be in the range of 25° to 60°.

In an embodiment of the purge nozzle assembly 10, the pull elements 24 may each exert a pulling force in along a pulling direction D1, D2. See in this respect the example shown in FIG. 8. An intersection point P of the pulling directions D1, D2 of the number of pull elements 24 may be substantially in a plane defined by the purge nozzle contact surface 18. By virtue of this construction, the intersection point P acts as a "pole" around which the nozzle will rotate when a very small movement is made at the start and the end of the contact with the wafer cassette 104 or the grommet 108 mounted thereon.

In a further elaboration of this embodiment, the intersection point P may be on the central axis L of the purge nozzle body 12.

In an embodiment, the outlet opening 16 may define an outlet axis which is collinear with the central axis L of the purge nozzle body 12.

Figure 2:
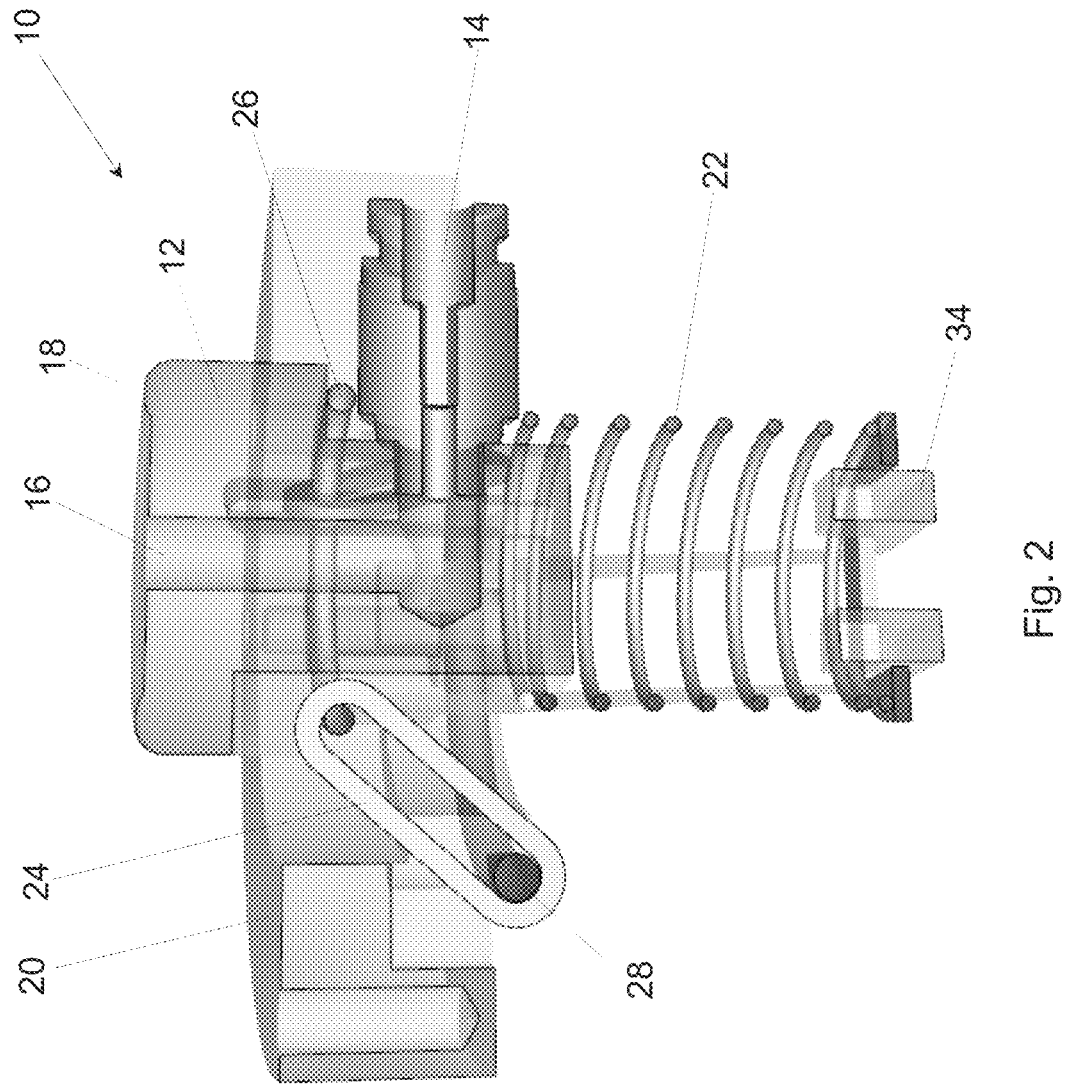
FIG. 2 shows a perspective cross sectional view of the example shown in FIG. 1.
Figure 3:
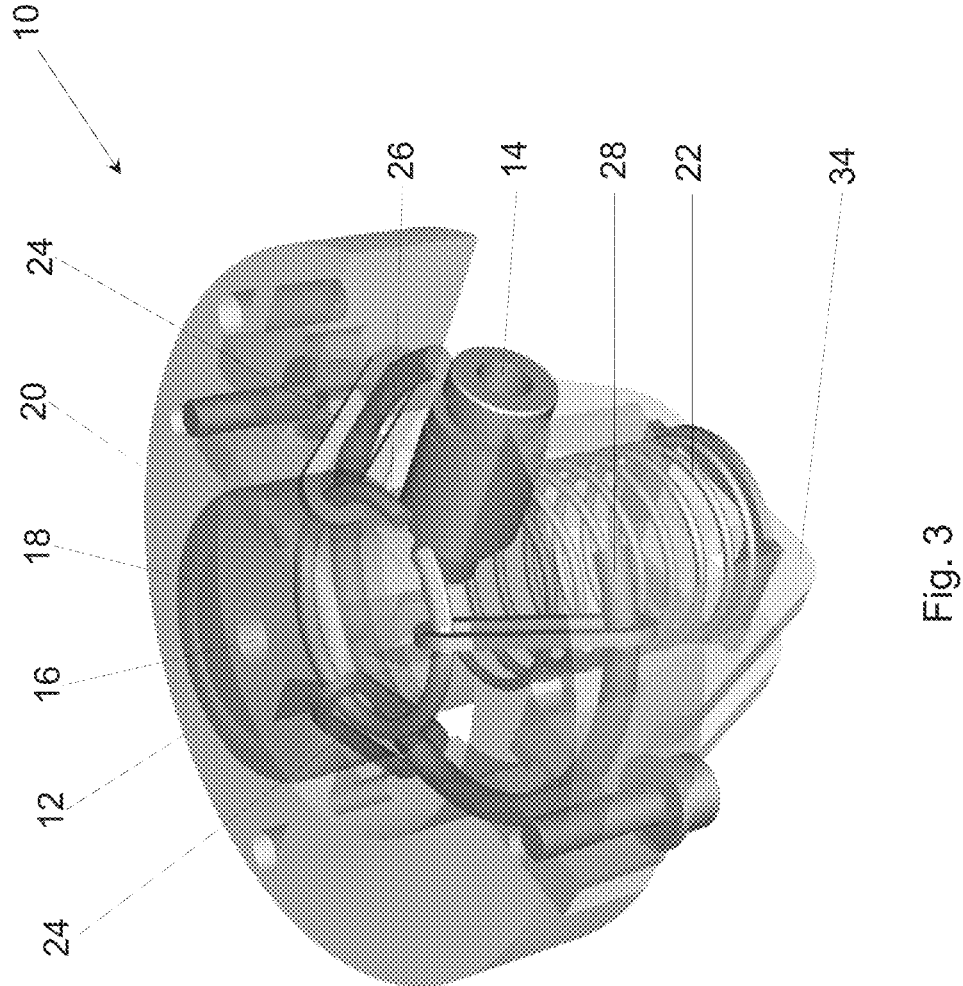
FIG. 3 shows a perspective view of the example shown in FIG. 1.
Figure 4:
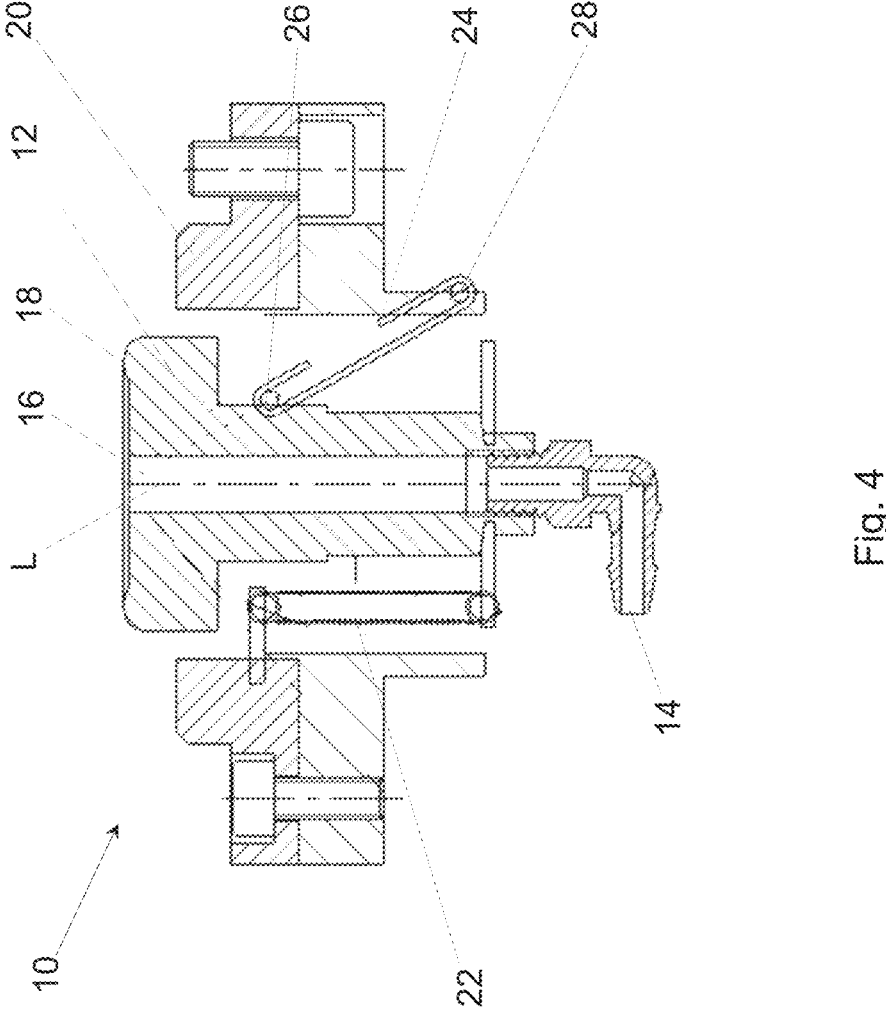
FIG. 4 shows a cross-sectional view of a second example of a purge nozzle.

In an embodiment, the at least one spring 22 may comprise at least one push spring 22. An example of an embodiment in which the at least one spring 22 is a push spring is shown in FIGS. 1-3.

In an embodiment, the at least one spring 22 may comprise at least one pull spring. Two examples of an embodiment in which the at least one spring is a pull spring are shown in FIG. 4 and FIGS. 5-7.

Figures 5, 6:
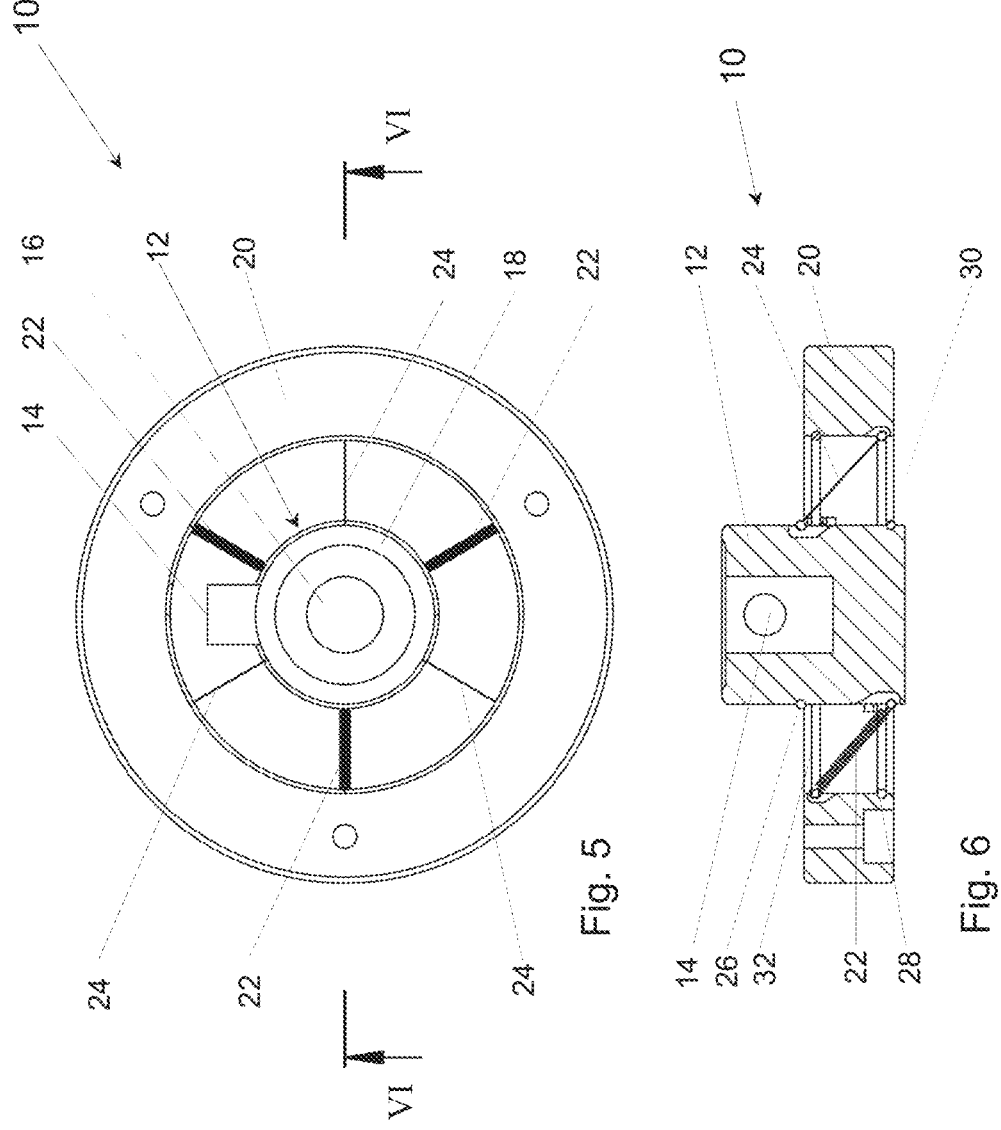
FIG. 5 shows a top view of a third example of a purge nozzle.
FIG. 6 shows a cross sectional view over line VI-VI from FIG. 5.
Figure 7:
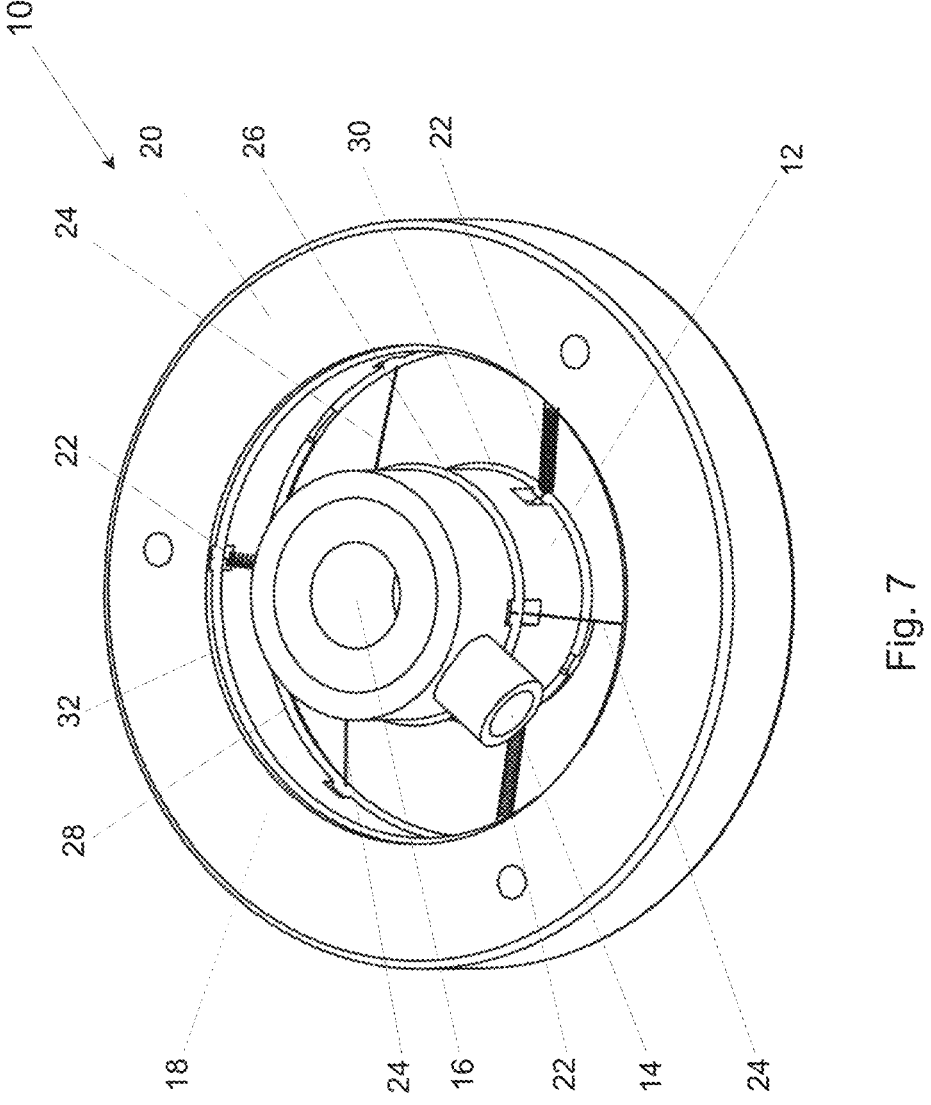
FIG. 7 shows a perspective view of the third example.

In an embodiment, each pull element 24 may comprise a cable, a rope or a chain. An example of an embodiment in which the pull elements 24 comprise a rope is shown in FIGS. 5-7.

In an embodiment, each pull element 24 may comprise a single link which may be slidably and pivotably connected with one of the purge nozzle body 12 and the mounting body 20 and which may be at least pivotably and optionally also slidably connected with the other one of the purge nozzle body 12 and the mounting body 20. Two examples in which each pull element 24 is embodied as a single link 24 are shown in FIGS. 1-3 and FIG. 4. A single link which may be slidably and pivotably connected with one of the purge nozzle body 12 and the mounting body 20 can be considered to have a similar behavior as a chain having a plurality of links.

In an embodiment of the purge nozzle assembly 10, the at least one pull element 24 may comprise three pull elements 24. Three pull elements 24 which may be spaced apart from each other over 120 degrees provide a stable and well defined initial position of the purge nozzle body 12 relative to the mounting body 20. Additionally, such a rotational symmetric configuration may provide similar movement behavior during lateral and tilting movement in all directions.

In an embodiment of the purge nozzle assembly 10, the at least one spring 22 may be a single spring. An example of this embodiment is shown in FIGS. 1-3.

In an embodiment of the purge nozzle assembly 10, the at least one spring 22 may be a plurality of springs, e.g. three springs. Two examples of this embodiment are shown in FIG. 4 and FIGS. 5-7.

Preferably, the at least one spring 22 may exert its force on the purge nozzle body 12 at a large enough distance from the central axis such that the at least one spring 22 biases the purge nozzle body in a horizontal position. For the embodiment that the at least one spring 22 may be a single spring 22, this may hold that the single spring may has a large enough diameter to create this levelling effect. A diameter of at least 10 mm may be desired. For the embodiment in which the at least one spring 22 may be a plurality of springs 22, e.g. three springs, these springs should be connected to the purge nozzle body 12 at a large enough diameter to create the levelling effect, e.g. at a diameter of at least 10 mm.

In an embodiment of the purge nozzle assembly 10, the at least one spring 22 may be a coil spring. In all examples shown in the figures, the at least one spring 22 is embodied as a coil spring also known as helical spring.

In an embodiment of the purge nozzle assembly 10, the purge nozzle body 12 may have a circular groove in a circumferential outer surface of the purge nozzle body 12 in which a purge body ring 26 may be mounted. The at least one pull element 24 may be connected to the purge body ring 26 to create the connection between the purge nozzle body 12 and the at least one pull element 24. An example of this embodiment is shown in FIGS. 1-3 and FIGS. 5-7. An advantage of a purge body ring 26 to connect the at least one pull element 24 may be that the thickness of the ring may be very small, e.g. 1 mm or less. Thus, the friction between the at least one pull element 24 and the purge body ring 24 may be very small. Consequently, these very small friction forces are insignificant and do not hinder the movement of the purge nozzle body 12.

In an embodiment of the purge nozzle assembly 10, the mounting body 20 may have a circular groove in a circumferential inner surface of the mounting body 20 in which a mounting body ring 28 may be mounted. The at least one pull element 24 may be connected to the mounting body ring 28 to create the connection between the mounting ring 20 and the at least one pull element 24. As with the purge body ring 26, the mounting body ring 28 may have a very small thickness, e.g. 1 mm or less. Again, the friction between the at least one pull element 24 and the mounting body ring 28 may be very small and so insignificant that they do not hinder the movement of the purge nozzle body 12.

Additionally, the mounting of the pull elements 24 with the purge body ring 26 and the mounting body ring 28 is easy and the construction is relatively cost effective.

In an embodiment of the purge nozzle assembly 10, of which an example is shown in FIGS. 5-7, the purge nozzle body 12 may have a second circular groove in a circumferential outer surface of the purge nozzle body 12 in which a second purge body ring 30 may be mounted. The at least one spring 22 may be connected to the second purge body ring 30 to create the connection between the purge nozzle body 12 and the at least one spring 22.

In an embodiment of the purge nozzle assembly 10, of which an example is shown in FIGS. 5-7, the mounting body 20 may have a second circular groove in a circumferential inner surface of the mounting body 20 in which a second mounting body ring 32 may be mounted. The at least one spring 22 may be connected to the second mounting body ring 32 to create the connection between the mounting body 20 and the at least one spring 22.

As with purge body ring 26 and the mounting body ring 28 for connecting the pull elements 24, the second purge body ring 30 and the second mounting body ring 32 for connecting the at least one spring 22, the friction forces between these rings 30, 32 on the one hand and the at least one spring 22 may be minimal and so insignificant that they do not hinder the movement of the purge nozzle body 12. Also, the second rings 30, 32 also provide an easy, reliable and cost effective solution for connecting the at least one spring 22 between the purge nozzle body 12 and the mounting body 20.

In an embodiment of the purge nozzle assembly 10, the purge nozzle body 12 may be substantially cylindrical shaped and the mounting body 20 may be a substantially ring shaped and may have a ring opening. The diameter of the ring opening may be larger than an outer diameter of the purge nozzle body 12. The examples shown in FIGS. 1-3, FIG. 4 and FIGS. 5-7 all have this configuration. By virtue of this configuration, the position and length of the pull elements 24 may be designed such that the freedom of movement of the purge nozzle body 12 may be such that all movements of the wafer cassette 104 which are allowed within the limits defined by the SEMI may be accommodated.

In an embodiment of the purge nozzle assembly 10, an example of which is shown in FIGS. 1-3, a push spring support frame 34 may be connected with the mounting body 20. The push spring 24 may be biased between the push spring support frame 34 and the purge nozzle body 12. The push spring support frame may be a separate part which is connected to the mounting body 20 or may be integrally formed with the mounting body 20.

In an embodiment, the purge nozzle assembly may be a monolithic part in which compliant systems are included. The monolithic part may be manufactured by means of 3D-printing. The design of the monolithic purge nozzle assembly may be configured to be 3D-printable. The benefits of a 3D-printed compliant purge nozzle may be that the purge nozzle may be of simplified design. Since it may be a monolithic structure no assembly will be required. Due to the fact that the purge nozzle assembly may be a single part may make it easy to service and more reliable. A 3D-printed part may reduce costs relative to a multi-part purge nozzle.

In a further elaboration of the 3D-printed purge nozzle, multi material 3D-printing may be used for variations in FOUPS and customer requirements.

Instead of 3D-printing, a monolithic part in which compliant systems are included may also be manufactured by means of injection molding, die casting or a similar molding technique.

The disclosure also provides a semiconductor processing assembly 100. An example of al relevant part of the semiconductor processing assembly 100 is schematically shown in FIG. 12. The semiconductor processing assembly 100 may comprise at least one wafer cassette supporting position 102 and at least one wafer cassette 104. The wafer cassette may comprise a purge port 106 for supplying purge gas into an interior of the wafer cassette 104. Optionally, a grommet 108 may be mounted on the wafer cassette 104 and may surround the purge port 106. The semiconductor processing assembly 100 may comprise a purge nozzle assembly 10 according to the present disclosure which may be positioned relative to the wafer cassette supporting position 102 such that, when a wafer cassette 106 is placed on the wafer cassette supporting position 102, the purge nozzle contact surface 18 may engage the wafer cassette 104 during placement of the wafer cassette 104 substantially without a rubbing or sliding movement between the purge nozzle contact surface 18 and the wafer cassette 104. Instead of or in addition to being mounted on the wafer cassette 104, the grommet 108 may also be mounted on the purge nozzle assembly 10.

Figures 8A, 8B, 9A, 9B:
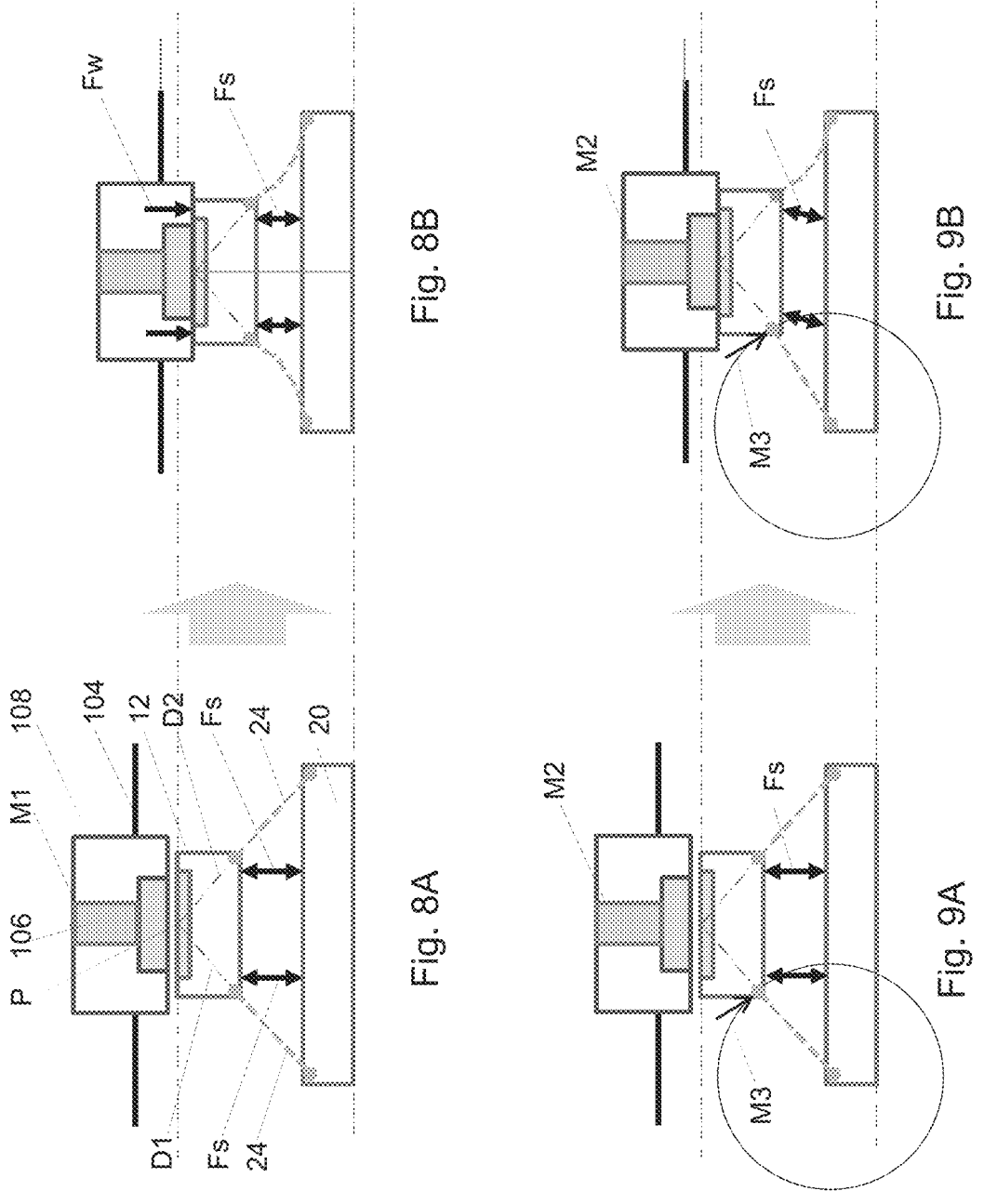
FIG. 8A shows a schematic cross-sectional view of a purge nozzle in an initial position and the purge port of a wafer cassette moving downwardly in a vertical direction.
FIG. 8B shows the same view as in FIG. 8A with a wafer cassette being placed vertically downwardly in its end position.
FIG. 9A shows a schematic cross-sectional view of a purge nozzle in an initial position and the purge port of a wafer cassette moving downwardly in a slanted direction.
FIG. 9B shows the same view as in FIG. 9A with the wafer cassette being placed downwardly along the slanted direction in its end position.

FIG. 8A shows a schematic cross-sectional view of a purge nozzle in an initial position and the purge port of a wafer cassette moving downwardly in a vertical direction indicated by arrow M1. The at least one spring 22, not shown in this figure, may exert forces indicated with arrows Fs on the purge nozzle body 12. During placement of the wafer cassette 104, the grommet 108 around the purge port 106 may exert a force indicated with arrows Fw on the purge nozzle body 12. FIG. 8B shows the wafer cassette 104 being placed vertically downwardly in its end position. As is clear from FIG. 8B, the pull elements 24 are not anymore pulled taut but are slack due to the downward movement of the purge nozzle body. The force Fs exerted by the at least one spring 22 may provide a good seal between the purge nozzle body 12 and the grommet 108.

FIG. 9A shows a schematic cross-sectional view of a purge nozzle in an initial position and the purge port of a wafer cassette moving downwardly in a slanted direction indicated with arrow M3. During the downward movement of the wafer cassette 104 the left pull element 24 remains taut whereas the right pull element 24 becomes slack as is clearly visible in FIG. 9B. The taut pull element 24 allows a movement of the purge nozzle body 12 along arrow M3 including a lateral movement component. Thus, even when the wafer cassette 104 moves in the slanted direction M2 downwardly, any rubbing or sliding of the purge nozzle body 12 along the grommet 108 may be prevented.

Figures 10A, 10B, 10C, 11:
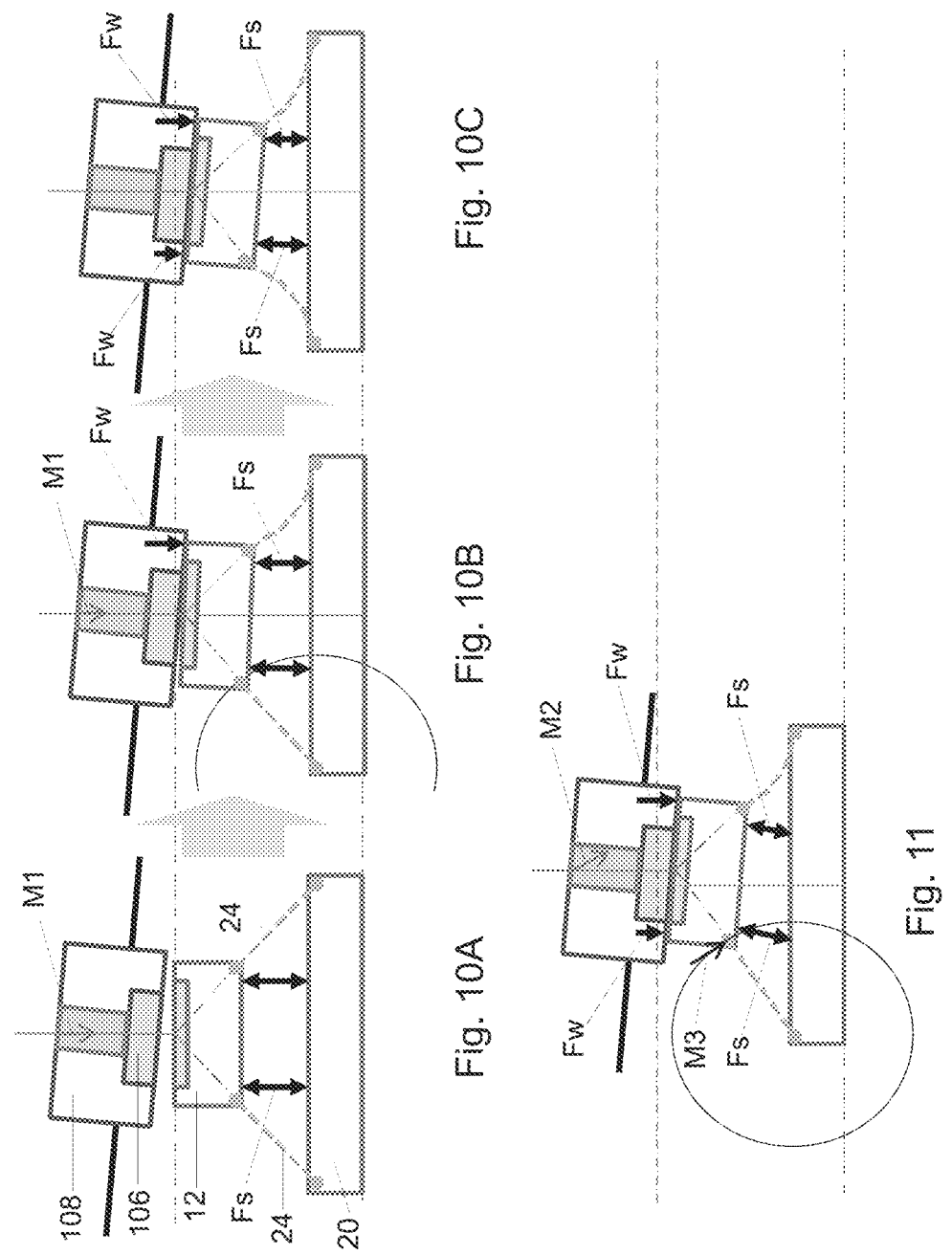
FIG. 10A shows a schematic cross-sectional view of a purge nozzle in an initial position and the purge port of a wafer cassette moving downwardly in a vertical direction and the wafer cassette with the purge port being in a tilted position relative to a horizontal plane.
FIG. 10B shows an intermediate position of the wafer cassette in which the grommet surrounding the purge port engages the purge nozzle body at the right side.
FIG. 10C shows an end position of the wafer cassette in which the purge nozzle body has been tilted at the same angle as the wafer cassette so that the entire purge nozzle contact surface is in contact with the grommet of the purge port.
FIG. 11 shows a similar end position as shown in FIG. 10C be it that the wafer cassette has not moved vertically downward but along a slanted direction.

FIG. 10A shows a schematic cross-sectional view of a purge nozzle in an initial position and the purge port of a wafer cassette moving downwardly in a vertical direction M1 and the wafer cassette 104 with the purge port 106 being in a tilted position relative to a horizontal plane. Please note how the pull elements 24 are first all taut (FIG. 10A) and subsequently the right pull element 24 becomes slack (FIG. 10B) and in the end position shown in FIG. 10C both pull elements 24 are slack. Also note that in FIG. 10B the first contact between the grommet 108 and the purge nozzle body 12 is at the right and the wafer cassette exerts a force Fw at that point on the purge nozzle body. The contact surface of the purge nozzle body 12 is not yet parallel with the contact surface of the grommet 108. In a next stage, shown in FIG. 10C, the grommet contact surface and the purge nozzle contact surface 18 are in full contact so that a leak tight engagement may be obtained. The forces Fs and Fw counteract each other and may provide sufficient compression force between the purge nozzle contact surface 18 and the grommet contact surface for creating a sufficiently gas tight engagement FIG. 11 shows a similar end position as shown in FIG. 10C be it that the wafer cassette has not moved vertically downward but along a slanted direction M2. In this situation, the left pull element 24 is still taut whereas the right pull element is slack.

In an embodiment of the semiconductor processing assembly, both the wafer cassette 104 and the wafer cassette supporting position 102 may be positioned relative to each other by means of a kinetic coupling 110. For such a kinetic coupling 110, the end position of the wafer cassette 104 is very precisely defined. Additionally, the SEMI defines the limits within which the wafer cassette may move laterally when being placed on such a kinetic coupling. Thus, the design of the purge nozzle 10 may be tuned to these limits so that the purge nozzle body 12 may freely move so as to accommodate all lateral movements of the wafer cassette 104 which are within the limits defined by the SEMI.

In an embodiment of the semiconductor processing assembly, the at least one spring 22 may, when the wafer cassette 104 is placed on the wafer cassette supporting position 102, exert a higher biasing force than in the initial position of the purge nozzle body 12. At least one of the pull elements 24 may not anymore be pulled taut by the at least one spring 22. Thus, the increased closing force provides an improved sealing between the purge nozzle body 12 and the grommet 108 surrounding the purge port 106 of the wafer cassette 104.

In an embodiment of the semiconductor processing assembly, the wafer cassette may be embodied as a Front Opening Unified Pod (FOUP).

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this description are not necessarily all referring to the same embodiment.

Furthermore, it is noted that particular features, structures, or characteristics of one or more of the various embodiments which are described above may be used implemented independently from one another and may be combined in any suitable manner to form new, not explicitly described embodiments. The reference numbers used in the detailed description and the claims do not limit the description of the embodiments, nor do they limit the claims. The reference numbers are solely used to clarify.

The invention claimed is:

1. A purge nozzle assembly comprising:
   a purge nozzle body including an inlet opening and an outlet opening wherein the outlet opening opens into a purge nozzle contact surface;
   a mounting body for connecting the purge nozzle assembly to an external frame member;
   a mechanical coupling mechanism moveably coupling the purge nozzle body with the mounting body and configured to:
   allow tilting of the purge nozzle body relative to the mounting body; and
   to allow a lateral movement of the purge nozzle body relative to the mounting body, wherein the lateral movement has a movement component which is substantially parallel to the contact surface,
   wherein the mechanical coupling mechanism comprises:
   at least one spring connected to the purge nozzle body and the mounting body and configured to bias the purge nozzle body relative to the mounting body in a direction substantially perpendicular to the purge nozzle contact surface and directed away from the purge nozzle contact surface, and
   a number of pull elements connected with the purge nozzle body and the mounting body, which pull elements are pulled taut by the at least one spring to provide a defined initial position of the purge nozzle body relative to the mounting body.

2. The purge nozzle assembly according to claim 1, wherein the lateral movement is substantially parallel to the contact surface.

3. The purge nozzle assembly of claim 1, wherein the pull elements each exert a pulling force in along a pulling direction, wherein an intersection point (P) of the pulling directions of the number of pull elements is substantially in a plane defined by the purge nozzle contact surface.

4. The purge nozzle assembly according to claim 3, wherein the intersection point (P) is on a central axis (L) of the purge nozzle body substantially perpendicular to the plane defined by the purge nozzle contact surface.

5. The purge nozzle assembly according to claim 3, wherein the outlet opening defines an outlet axis which is collinear with the central axis (L) of the purge nozzle body.

6. The purge nozzle assembly according to claim 1, wherein the at least one spring comprises at least one push spring.

7. The purge nozzle assembly according to claim 1, wherein the at least one spring comprises at least one pull spring.

8. The purge nozzle assembly according to claim 1, wherein each pull element comprises a cable, a rope, a chain.

9. The purge nozzle assembly according to claim 1, wherein each pull element comprises a single link which is slidably and pivotably connected with one of the purge nozzle body and the mounting body and which is at least pivotably and optionally also slidably connected with the other one of the purge nozzle body and the mounting body.

10. The purge nozzle assembly according to claim 1, wherein the number of pull elements comprises three pull elements.

11. The purge nozzle assembly according to claim 1, wherein the at least one spring is a single spring.

12. The purge nozzle assembly according to claim 1, wherein the at least one spring is a plurality of springs.

13. The purge nozzle assembly according to claim 1, wherein the at least one spring is a coil spring.

14. The purge nozzle assembly according to claim 1, wherein the purge nozzle body has a circular groove in a circumferential outer surface of the purge nozzle body in which a purge body ring is mounted, wherein the at least one pull element is connected to the purge body ring to create the connection between the purge nozzle body and the at least one pull element.

15. The purge nozzle assembly according to claim 1, wherein the mounting body has a circular groove in a circumferential inner surface of the mounting body in which an mounting body ring is mounted, wherein the at least one pull element is connected to the mounting body ring to create the connection between the mounting ring and the at least one pull element.

16. The purge nozzle assembly according to claim 1, wherein the purge nozzle body has a second circular groove in a circumferential outer surface of the purge nozzle body in which a second purge body ring is mounted, wherein the at least one spring is connected to the second purge body ring to create the connection between the purge nozzle body and the at least one spring.

17. The purge nozzle assembly according to claim 1, wherein the mounting body has a second circular groove in a circumferential inner surface of the mounting body in which a second mounting body ring is mounted, wherein the at least one spring is connected to the second mounting body ring to create the connection between the mounting body and the at least one spring.

18. The purge nozzle assembly according claim 1, wherein the purge nozzle body is substantially cylindrical shaped and the mounting body is a substantially ring shaped having a ring opening, wherein the diameter of the ring opening is larger than an outer diameter of the purge nozzle body.

19. The purge nozzle assembly according to claim 18, wherein the at least one spring comprises at least one push spring, wherein a support push spring support frame is connected with the mounting body, wherein the push spring is biased between the push spring support frame and the purge nozzle body.

20. The purge nozzle assembly according to claim 1, wherein, a length of each pull element is at least 10 mm and an angle of each pull element relative to the horizontal plane is in the range of 25° to 60°.

21. A semiconductor processing assembly comprising at least one wafer cassette supporting position and at least one wafer cassette, wherein the wafer cassette comprises a purge port for supplying purge gas into an interior of the wafer cassette, wherein semiconductor processing assembly comprises a purge nozzle assembly according to claim 1, which is positioned relative to the wafer cassette supporting position such that, when a wafer cassette is placed on the wafer cassette supporting position, the purge nozzle contact surface engages the wafer cassette around the purge port during placement of the wafer cassette without a rubbing or sliding movement between the purge nozzle contact surface and the wafer cassette.

22. The semiconductor processing assembly according to claim 21, wherein both the wafer cassette and the wafer cassette supporting position are positioned relative to each other by means of a kinetic coupling.

23. The semiconductor processing assembly according to claim 21, wherein a purge nozzle assembly comprises a mechanical coupling mechanism comprising:

at least one spring connected to the purge nozzle body and the mounting body and configured to bias the purge nozzle body relative to the mounting body in a direction substantially perpendicular to the purge nozzle contact surface and directed away from the purge nozzle contact surface;

a number of pull elements connected with the purge nozzle body and the mounting body, which pull elements are pulled taut by the at least one spring to provide a defined initial position of the purge nozzle body relative to the mounting body, wherein, when the wafer cassette is placed on the wafer cassette supporting position, the at least one spring is exerting a higher biasing force than in the initial position of the purge nozzle body and wherein at least one of the pull elements is not any more pulled taut by the at least one spring.

24. The semiconductor processing assembly according to claim 21, wherein the wafer cassette is embodied as a Front Opening Unified Pod (FOUP).

* * * * *